(12) United States Patent
Chong et al.

(10) Patent No.: US 7,739,644 B1
(45) Date of Patent: Jun. 15, 2010

(54) METHODS, SYSTEMS, AND COMPUTER PROGRAM PRODUCTS FOR GRID-MORPHING TECHNIQUES IN PLACEMENT, FLOORPLANNING, AND LEGALIZATION

(75) Inventors: Philip Chong, Berkeley, CA (US); Christian Szegedy, Albany, CA (US)

(73) Assignee: Candence Design Systems, Inc., San Jose, CA (US)

(*) Notice: Subject to any disclaimer, the term of this patent is extended or adjusted under 35 U.S.C. 154(b) by 185 days.

(21) Appl. No.: 11/838,193

(22) Filed: Aug. 13, 2007

(51) Int. Cl.
*G06F 17/50* (2006.01)
(52) U.S. Cl. .................. 716/9; 716/10; 716/11
(58) Field of Classification Search ........... None
See application file for complete search history.

(56) References Cited

U.S. PATENT DOCUMENTS

| | | | |
|---|---|---|---|
| 5,636,129 A * | 6/1997 | Her | 716/12 |
| 6,249,902 B1 | 6/2001 | Igusa et al. | |
| 7,073,144 B2 * | 7/2006 | Alpert et al. | 716/5 |
| 7,076,746 B2 | 7/2006 | Hamlin et al. | |
| 7,076,755 B2 | 7/2006 | Ren et al. | |
| 7,266,796 B1 * | 9/2007 | Chu et al. | 716/9 |
| 2007/0204252 A1 * | 8/2007 | Furnish et al. | 716/10 |

OTHER PUBLICATIONS

Xiu et al., "Large-Scale Placement by Grid-Warping", DAC 2004, pp. 351-356.*
Alpert et al., "Faster Minimization of Linear Wirelength for Global Placement," ISPD 1997, pp. 4-11.*
Alpert et al., "Plcament Stability Metrics," 2005 IEEE, pp. 1144-1147.*
Brenner et al., "Legalizing a Placement with Total Minimum Movement," IEEE Trans. on CAD of ICs and Systems, vol. 23, No. 12, Dec. 2004, pp. 1597-1613.*
Caldwell et al., "Can Recursive Bisection Alone Produce Routable Placement?", DAC 2000, pp. 477-482.*
Kahng et al., "Architecture and Details of a High Quality, Large-Scale Analytical Placer," 2005 IEEE, pp. 890-897.*
Kleinhans et al., "Gordian: VLSI Placement by Quadradtic Programming and Slicing Optimization," IEEE Trans. on CAD, vol. 10, No. 3, Mar. 1991, pp. 356-365.*
Nam et al., "The ISPD2005 Placement Contest and Benchmark Suite," ISPD 2005, pp. 216-220.*
Ren et al., "Diffusion-Based Placement Migration," DAC 2005, pp. 515-520.*
Sechen et al., "The TimberWolf Placement and Routing Package," IEEE Journal of Solid-State Circuits, vol. SOC-20, No. 2, Apr. 1985, pp. 510-522.*

(Continued)

*Primary Examiner*—Leigh Marie Garbowski
(74) *Attorney, Agent, or Firm*—Vista IP Law Group, LLP.

(57) ABSTRACT

Disclosed are methods, systems, and computer program products for performing grid morphing technique for computing a spreading of objects over an area such that the final locations of the objects are distributed over the area and such that the final locations of the objects are minimally perturbed from their initial starting locations and the density of objects meets certain constraints. The minimization of perturbation, or stability, of the approaches disclosed, is the key feature which is the principal benefit of the techniques disclosed. The methods described herein may be used as part of a tool for placement or floorplanning of logic gates or larger macroblocks for the design of an integrated circuit.

30 Claims, 13 Drawing Sheets

OTHER PUBLICATIONS

Sigl et al., "Analytical Placement: A Linear of a Quadratic Objective Function?", $28^{th}$ ACM/IEEE Design Automation Conference, pp. 427-432.*

Tsay et al., "Proud: A Sea-of-Gates Placement Algorithm," 1988 IEEE Design & Test of Computers, pp. 44-56.*

Viswanathan et al., "FastPlace: Efficient Analytical Placement using Cell Shifting, Iterative Local Refinement and a Hybrid Net Model," ISPD 2004, pp. 26-33.*

Vygen, "Algorithms for Large-Scale Flat Placement," DAC 1997, 6 pages.*

Chong et al., "A Morphing Approach to Address Placement Stability," ISPD '07, Mar. 18-21, 2007, Austin, Texas, pp. 95-102.

Heckbert, P.S. "Fundamentals of texture mapping and image warping," Master's thesis, University of California, Berkeley, 1989, pp. 1-86.

Roy, J. et al, "Capo: Robust and Scalable Open-Source Min-Cut Floorplacer" ISPD '05, Apr. 3-6, 2005, San Francisco, CA, pp. 224-226.

Non-Final Office Action dated Mar. 5, 2010 for U.S. Appl. No. 11/838,187.

* cited by examiner

METHODS, SYSTEMS, AND COMPUTER PROGRAM PRODUCTS FOR GRID-MORPHING TECHNIQUES IN PLACEMENT, FLOORPLANNING, AND LEGALIZATION

BACKGROUND AND SUMMARY

Placement remains a critical step in the RTL to GDS II or equivalents synthesis process. The exponential growth of complexity in integrated circuits designs has dramatically increased the demand for better optimization of the placement algorithms. Recent development of placement algorithms often ignores an important feature of all placement techniques—stability and thus leads to undesired waste of computation resources.

A placement tool is considered to offer stability if, for two starting designs which exhibit only small differences between them, the resulting final designs also have small or limited differences. That is, a small change in the input design results in a small change in the final output. For example, stability is important for an incremental design flow where a circuit designer who introduces small changes to a design will want to obtain a new placement incorporating those changes but with minimal effect on the unchanged portions of the design. Placement tools with good stability may also prevent undesired waste of computational resources and runtime that may increase the cost of the design as well as delay the intended time to market.

There are several existing approaches to address the overall placement problem, yet none of which have emphasized placement stability. Some of these approaches start by computing an initial placement, which may not be feasible in that many gates overlap each other. This initial placement is then modified so as to remove the overlaps between the gates. Typical placement tools tend to iteratively and incrementally remove a fraction of the overlaps at a time until the overlaps are reduced to an extent so the detailed placement tool can determine a completely legal and non-overlapping layout.

Existing approaches to remove overlaps from an initial placement have several drawbacks. For example, one approach is to use partitioning techniques, such as minimum-cut partitioning, in a divide-and-conquer fashion to split the die into smaller regions. The netlist is also divided among the subregions of the die so that each subregion represents a smaller spreading sub-problem which can be solved more easily, perhaps through recursive application of partitioning. Such techniques have a drawback in that small changes to the starting netlist may result in large changes to the final result. Such instability leads to relatively unpredictable performance of such algorithms.

Another approach to gate spreading is the so-called force-directed method. In algorithms adopting the force-directed method, the overlaps between the gates are used to generate repulsive forces which push the gates away from the areas of overlap. This key drawback to this approach is that it is difficult to determine a suitable magnitude of force necessary to resolve any particular overlap which can lead to excessive computational complexity and runtime of the algorithm.

A recently proposed approach to gate spreading is the grid-warping technique as first published by *Large-Scale Placement by Grid-Warping* by Z. Xiu, J. D. Ma, S. M. Fowler, and R. A. Rutenbar, Design Automation Conference 2004. The grid-warping technique relies on transforming small slicing structures to a regular grid using non-linear programming solver. The disadvantage of grid-warping algorithms is the relatively high computational cost and runtime involved. Moreover, the grid-warping algorithms optimize the placement solely for netlength minimization rather than for stability optimization.

Thus, a need exists for computing a spread of objects over an area such that the final locations of the objects are relatively uniformly spread over the entire area by grid morphing and such that the final locations of the objects are minimally perturbed from their initial starting locations and therefore minimizing the perturbation to the placement of the design features and thus maintaining the stability of the placement.

The present invention transforms a grid superposed on the placement area to another grid and subsequently re-computes the locations of the gates based on that transformation. One of the advantages of the grid morphing technique is that the computation for the new locations of the gates can be done more quickly. Another advantage of the grid morphing technique is the minimal or even no overlapping due to smoothly moving cells while preserving the relative positions of the cells during the grid morphing process to spread the gates. Moreover, some embodiments of the invention may incorporate various characteristics of the design in the grid morphing objective functions and/or the solver without significant increase in runtime overhead.

BRIEF DESCRIPTION OF THE FIGURES

The drawings illustrate the design and utility of various embodiments of the invention. It should be noted that the figures are not drawn to scale and that elements of similar structures or functions are represented by like reference numerals throughout the figures. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only some embodiments of the invention and are not therefore to be considered limiting of its scope, various embodiments of the invention will be described and explained with additional specificity and detail through the use of the accompanying drawings in which.

DETAILED DESCRIPTION

The present invention is directed to an improved methods, system, and computer program product for the placement of objects in a predefined area by grid morphing. As noted above, conventional methods and systems oftentimes ignore placement stability and thus cause unnecessary and undesired waste of runtime and computation resources.

According to some embodiments, the placement tool imposes a regular grid over the placement area, identifies a cell and an objective function, minimizes the objective function to determine the new locations of the cell after the grid morphing process, and then morph the cell and map the gates or other design features within the cell according to the new locations of the cell.

Yet some other embodiments use a pressure-based solver to determine the new locations of the cell after grid morphing. Yet some other embodiments further define sensitivity of a characteristic of the design with respect to the geometric changes of the cell and modify the objective function and/or the pressure-based solver.

Yet some other embodiments incorporate one or more additional constraints on the placement density to incorporate the placement density control within the grid-morphing process. One of the purposes of incorporating the density control within the grid-morphing process is to maintain stability of the grid morphing process by preventing excessive change in cell areas during grid morphing.

Figure 1:
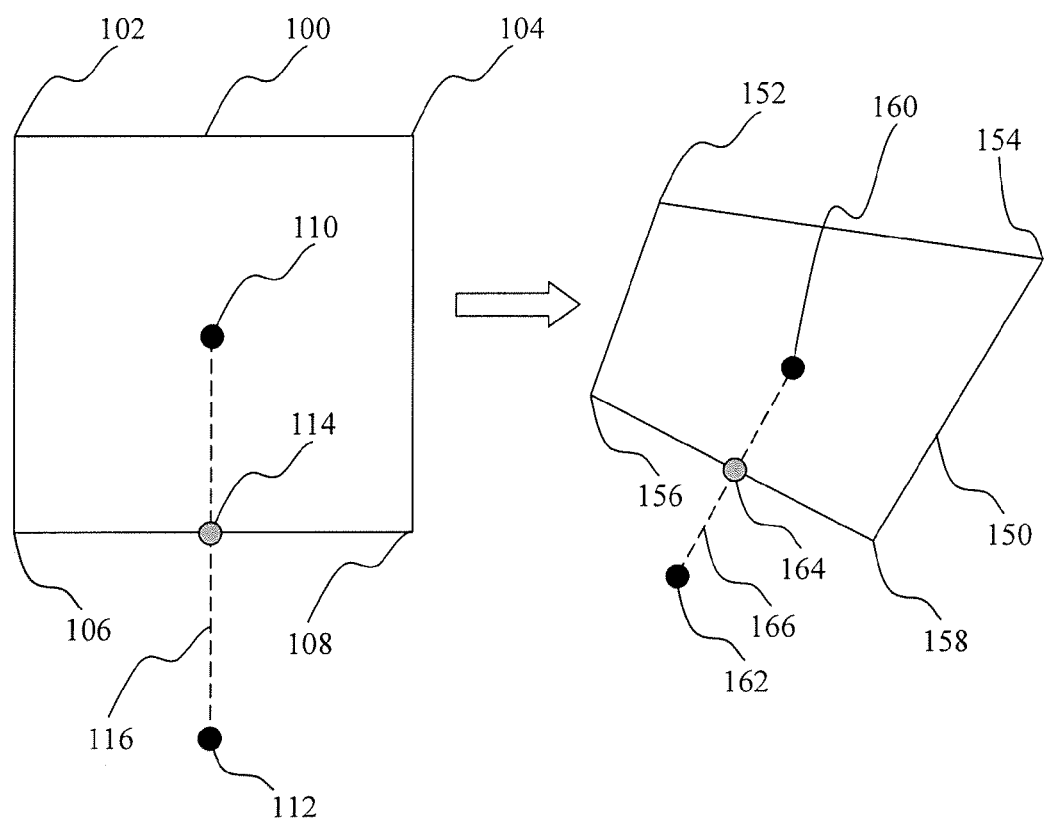
FIG. 1 illustrates a morphing a regular rectangular grid into a irregular quadrilateral grid.

Referring to FIG. 1 which depict a graphical representation of the grid morphing process that transforms a regular rectangular grid, 100, into a irregular quadrilateral grid, 150. 110 and 160 denote the center points for grid 100 and 150 respectively. The intersection between the line segment, 116, connecting center points 110 and 112 of another grid (not shown) and the edge connecting corner points 106 and 108 denote the border point, 114, on that edge. The corresponding border point, 164, after one iteration of grid morphing also constitutes the intersection of the line segment, 166, connecting the two centers, 160 and 162, and the edge connecting the corner points 156 and 158. The four corners of the grid 102, 104, 106, and 108 denote the corner points of the grid 100. The four corners, 152, 154, 156, and 158, of the grid 150 denote the new locations of the respective four corners 102, 104, 106, and 108 after one iteration of grid morphing. Note that a corner point may also be defined as the intersection of the line segments each of which joins a pair of border points.

Figure 2:
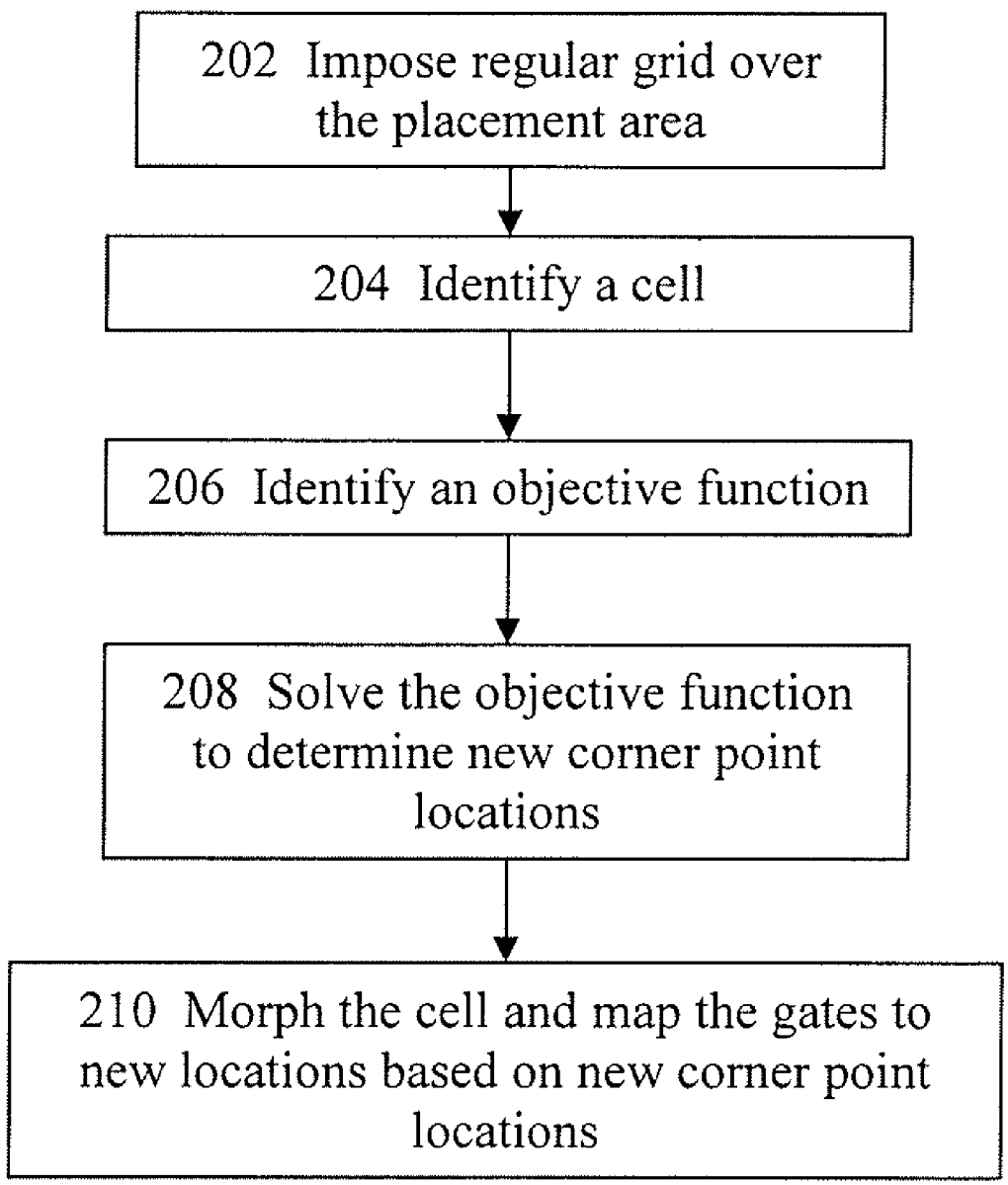
FIG. 2 illustrates a general flow of the methodology employing the grid morphing technique.

Referring to FIG. 2 which illustrates some embodiments of a method for the grid morphing placement technique. At 202, the method imposes a regular grid over the placement area. The grid may consist of regular rectangular cells with the sides parallel to the boundaries of the placement area. In the alternative, the grid may also consist of rectangular cells with the sides sitting at an angle with respect to the boundaries of the placement area. At 204, the method identifies a cell in the grid. The method then identifies or determines one or more objective functions for placement at 206. One example of such objective function is to minimize the relative perturbation to the corner points while satisfying the area constraints for the cells. A mathematical representation of this type of objective function may be given as follows:

$$\text{minimize} \sum_{(i,j) \in E} (d(p'_i, p'_j) - d(p_i, p_j))^2 \tag{1}$$

$$\text{subject to } A'_n \geq A_n \forall n \in N$$

In the above mathematical representation of the objective function, $A_n$ denotes the target area of cell n, $A_n'$ denotes the area of cell n computed after morphing the corner points $p_i$ and $p_j$ to locations $p_i'$ and $p_j'$. $d(p_i, p_j)$ denotes the distances between the points $p_i$ and $p_j$, and $d(p_i', p_j')$ denotes the distances between the points $p_i$ and $p_j$ after one iteration of grid morphing. E denotes the set of edges in the grid connecting a pair of adjacent corner points. N denotes the set of cells.

Note that the objective of this optimization is minimizing the relative perturbation and therefore maximizing the stability of the morphing. This optimization problem is convex with non-convex constraints.

Referring back to FIG. 2. At 208, the method then minimizes the objective function to determine new corner point locations after grid morphing. One way of solving this problem is to apply a relaxation method such as a Lagrangian relaxation method to relax the constraints and then apply a numerical solver such as a subgradient method to solve for the dual variables, and obtain new locations for the corner points, thus morphing the entire grid at once. The sub-gradient method is generally slow and numerical unstable for this kind of problem. Another way of solving this problem is to apply a relaxation method first to relax the constraints and then use a pressure-based solver to solve the problem more efficiently. The pressure-based solver will be described in more details in the subsequent sections. Finally, at 210, the method may then morph the cell and map the gates and other design features to new locations based on the new corner point locations after grid morphing.

Figure 3A:
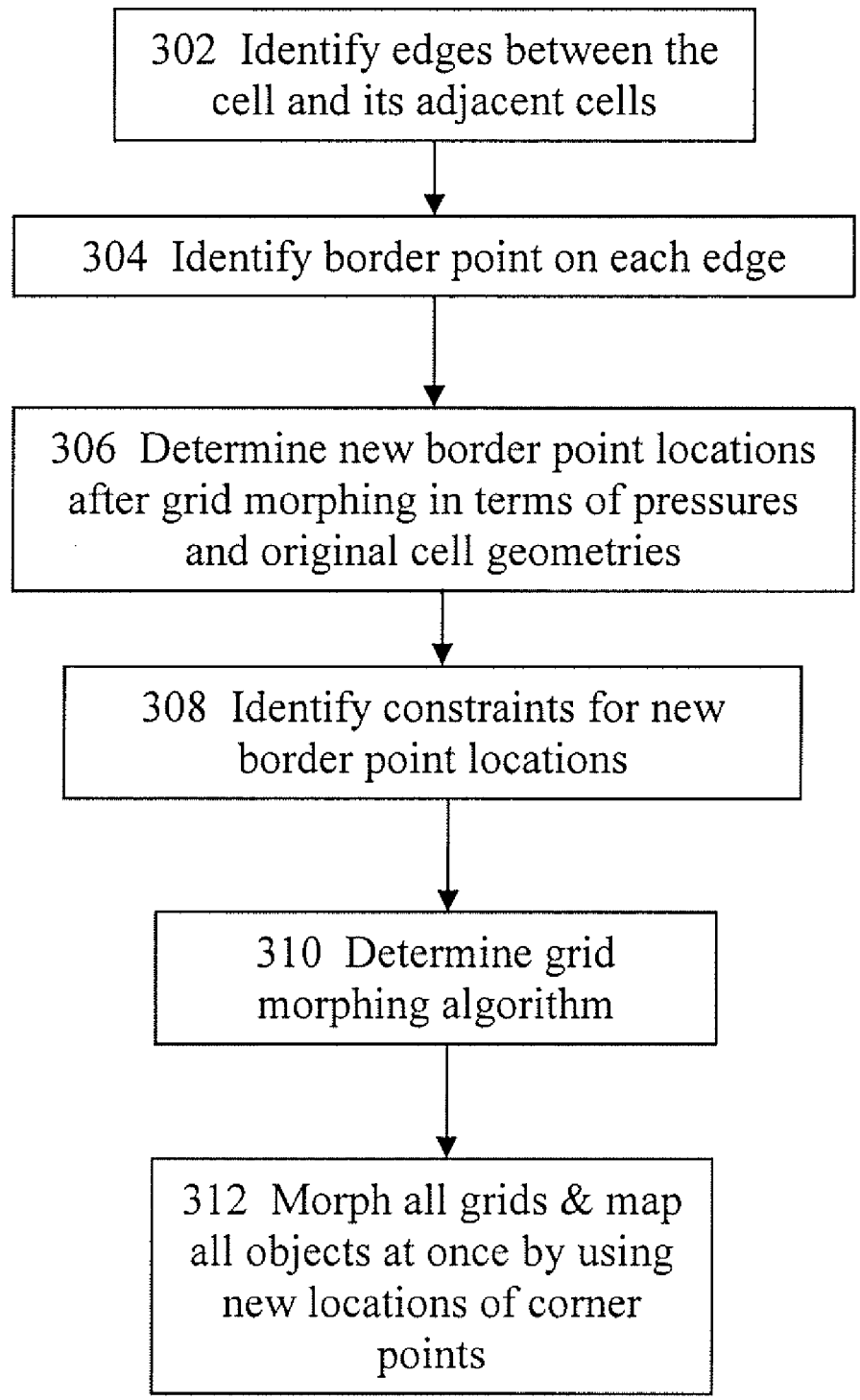
FIGS. 3A-3C illustrate an example of the grid morphing technique by using a pressure-based solver to morph the grids and map the design features.

FIG. 3A illustrates an example of some embodiments employing a method of grid morphing utilizing a pressure based solver to determine the new corner point locations after one iteration of grid morphing. The method first identifies one or more edges between a cell and its adjacent cells at 302. At 304, the method identifies a border point on each of the one or more edges. At 306, the method identifies and determines a new location for each of the identified border point after grid morphing in terms of pressures and the original geometries of the adjacent cells. At 308, the method identifies one or more constraints for the new border point locations. At 310, the method then determines the grid morphing solution by determining, based upon the new border point locations, the new locations of the corner points each of which represents the intersection of two line segments joining a pair of border points. The determination of the new locations of the corner points is based in part upon one or more objective functions and constraints on the cells. At 312, the method then performs the grid morphing algorithm and maps all objects at once.

Figure 3B:
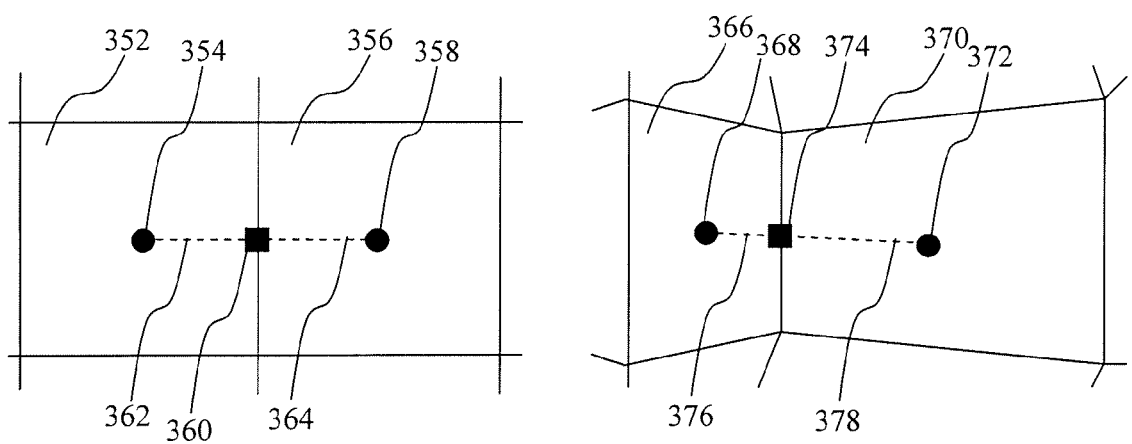
Figure 3C:
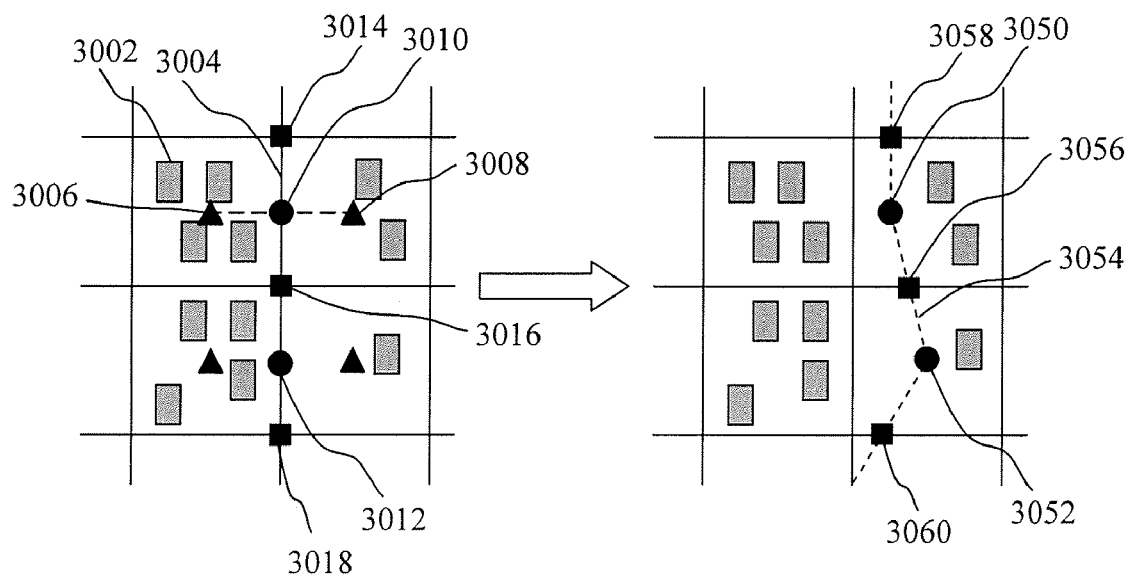

FIG. 3C depicts a simplified illustration of the above method where the left hand side represents part of a grid before a particular grid morphing iteration, and the right hand side represents the new locations of the border and corner points. On the left hand side, each of the small solid triangles (3006 and 3008) represents the center point of a cell respectively. 3004 represents an edge between two adjacent cells. 3010 and 3012 represent original border point locations. 3014, 3016, and 3018 represent the corner points. After the method determines the new border point locations 3050 and 3052, the method may then determine the grid morphing solution. The method may thus perform the grid morphing algorithm to determine the new corner point locations 3056, 3058, and 3060 and to morph the grid and move the objects of interest with an edge (3054) joining two of the new corner point locations (3050 and 3052).

Figure 4:
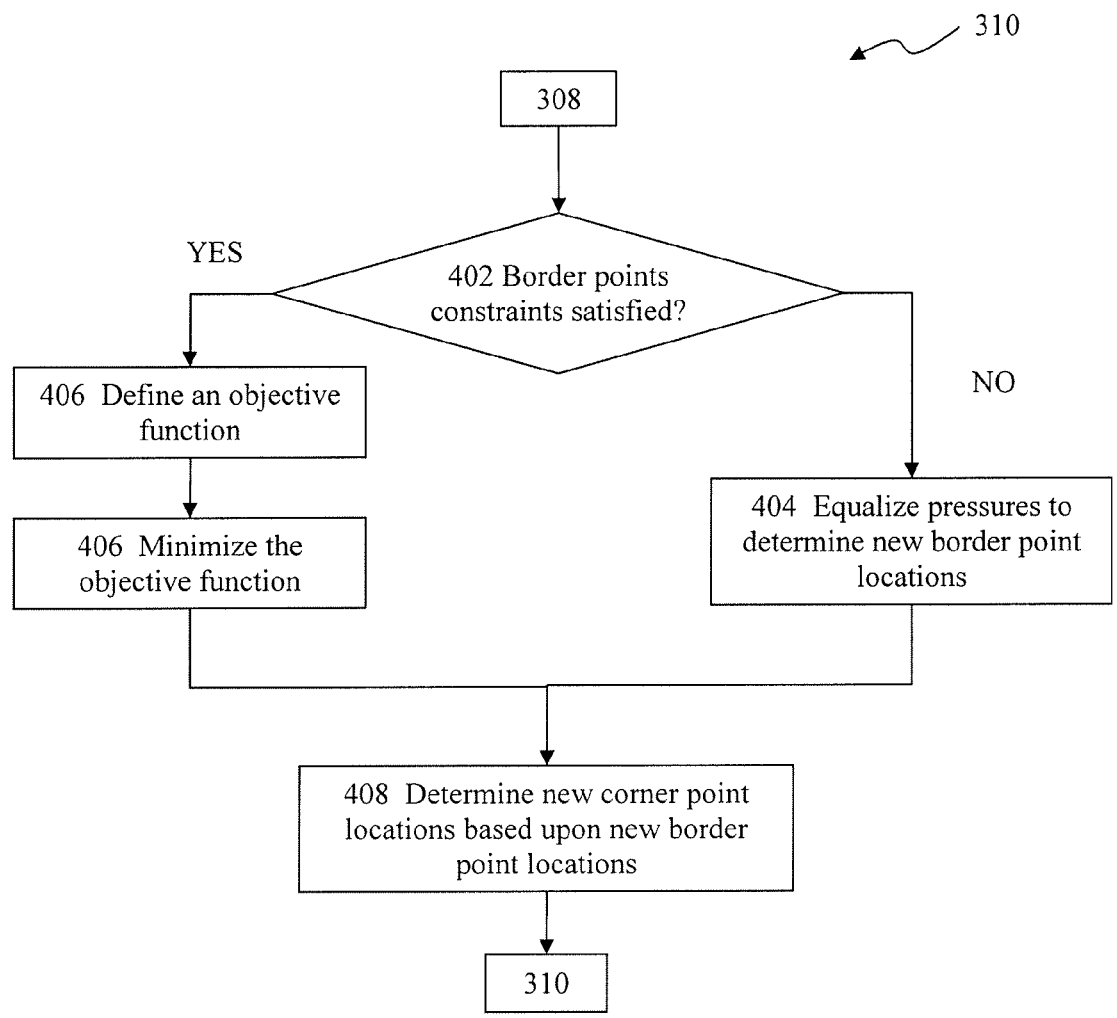
FIG. 4 illustrates an example of using a pressure-based solver to determine the grids after the grid morphing process.

FIG. 4 illustrates an example of using a pressure-based solver to determine the grids after the grid morphing process. The method continues from step 308 in FIG. 3. The method then identifies constraints for new border point locations and then determines whether the constraints on border points are satisfied at 402. Where some of the border point constraints are not satisfied, the method then equalizes the pressures of the two adjacent cells to determine the new border point locations at 404. Once the new border point locations are determined, the method then proceeds to step 410 to determine the new locations of the corner points each of which is defined to be the intersection of two line segment each joining a pair of border points.

Where all of the border point constraints are satisfied, the method then proceeds to step 406 to define one or more objective functions. At 408, the method then seeks to optimize the one or more objective functions to determine the new border point locations. Once the new border point locations are determined, the method then proceeds to step 410 to determine the new locations of the corner points each of which is defined to be the intersection of two line segment each joining a pair of border points. Note that the method iteratively repeats the above processes until all the area constraints in Equation (1) are satisfied.

The following illustrates an example for the above algorithm of determining the new corner point locations after one iteration of grid morphing based in part upon on the new border point locations. The new border point location may be defined in terms of the center points of the actual cells as follows:

$$b = x \cdot c_1 + (1-x) \cdot c_2 \quad (2)$$

where $x \in [0,1]$ where c1 and c2 are the center points of the adjacent cells 1 and 2 respectively.

In the above mathematical representation, b denotes the new border point location after one iteration of grid morphing. $c_1$ and $c_2$ denote the two center points defining the original border point, and x denotes a real variable within the range of [0, 1]. The method identifies constraints for new border point locations. Some embodiments may employ, for example, the following set of constraints for the variable x:

$$0 \leq x \leq 1 \quad (3)$$

$$x \geq \frac{d_1 \cdot p_1}{d_1 + d_2}, \quad p_1 = \sqrt{\frac{A_1}{a_1}}$$

$$(1-x) \geq \frac{d_2 \cdot p_2}{d_1 + d_2}, \quad p_2 = \sqrt{\frac{A_2}{a_2}},$$

where p1 and p2 are the respective pressures or blow-up factors for cell 1 and cell 2.

If all the above three constraints for the new border point locations can be satisfied, the method then defines the objective function to be the quadratic function as follows:

$$[x \cdot (d_1+d_2)-D_1]^2 + [(1-x) \cdot (d_1+d_2)-D_2]^2 \quad (4)$$

Referring to FIG. 3B which illustrates the nomenclatures used in the above exemplary set of constraints. In the above mathematical representations, A1 (352) and A2 (356) denote the target areas of two adjacent cells. Note that the target area of a cell is defined to be the summation of all actual design features in the cell. a1 (366) and a2 (370) denote the actual areas of the two adjacent cells. C1 (354) and C2 (358) denote the respective center points of cell A1 (352) and A2 (356). 368 and 372 denote the corresponding respective center points of the two adjacent cells in the actual area representation. 360 denote a border point in the target area representation of the cells A1 and A2, and D1 (362) and D2 (364) respectively denote the distances between C1 (354) and 360 and C2 (358) and 360. 374 denotes the corresponding border point in the actual area representation of the two adjacent cells. P1 and P2 denote the respective pressures (or blowup factors) for the two adjacent cells, and each of which defined as the square root of the ratio of the target area and the actual area of the respective cell. d1 (376) and d2 (378) denote the distance between the respective center point and the border point in the actual area representation of the two adjacent cells.

The method may then proceed to optimize the above objective function. In this case, the method minimizes the above quadratic function to solve for the variable x. Then the method may determine the new border point locations after solving for the variable x. Since the corner points are defined to be the intersection of two line segments each of which joins a pair of border points, the method may then determine the new corner point locations, the new corner point locations may then be determined once the new border point locations are determined.

Where not all of the above constraints for border points are satisfied, the method may then equalize the pressures by solving for the variable x according to the following formula:

$$\frac{x \cdot d_1}{p_1} = \frac{(1-x) \cdot d_2}{p_2} \quad (5)$$

Solving for x from the above from the above formula gives the following solution for variable x:

$$x = \frac{1}{1 + \frac{d_1 \cdot p_2}{d_2 \cdot p_1}} \quad (6)$$

The method then determines the new border point locations after solving for the variable x. Since the corner points are defined to be the intersection of two line segments each of which joins a pair of border points, the method may then determine the new corner point locations, the new corner point locations may then be determined once the new border point locations are determined.

Figure 5:
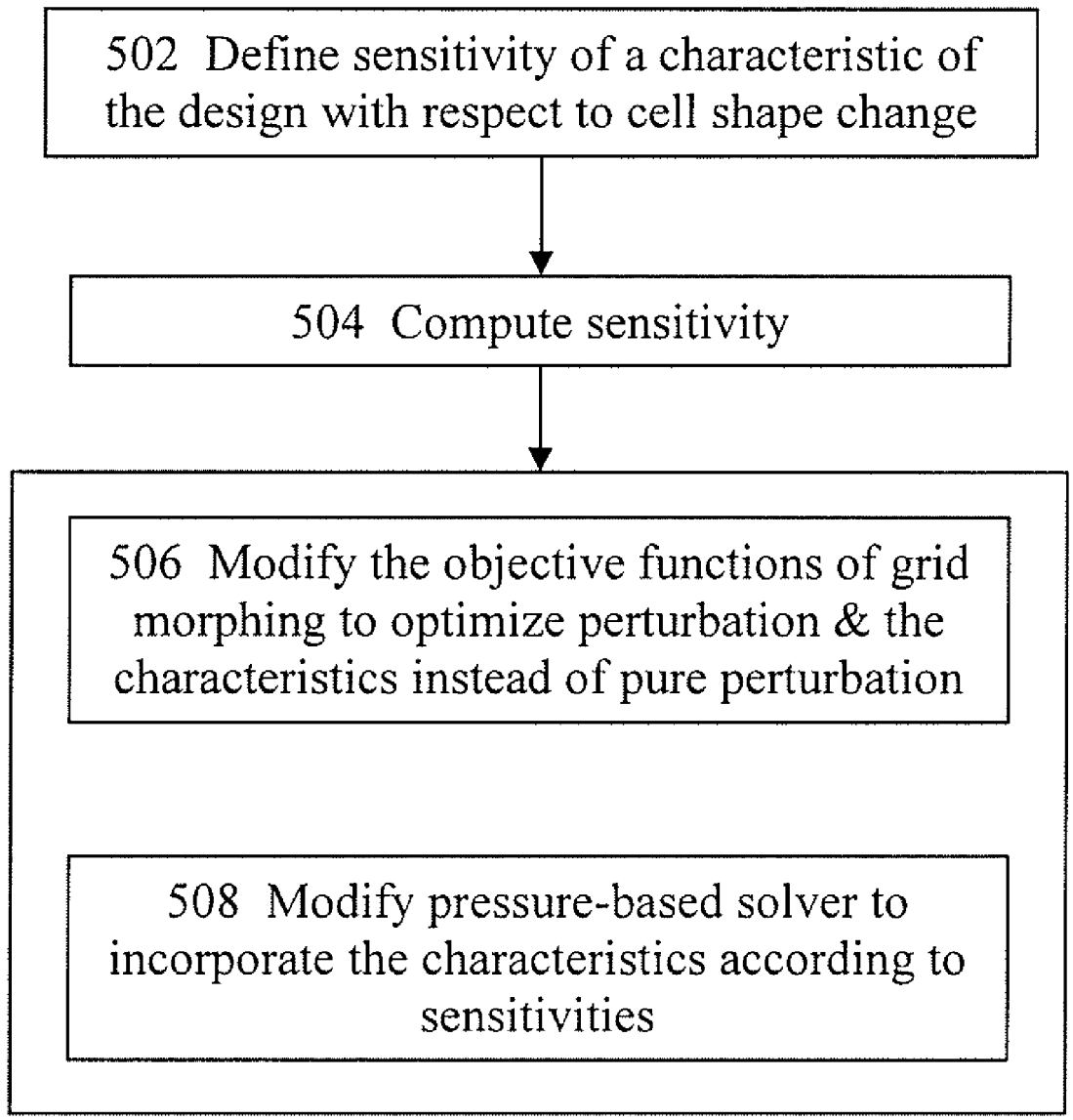
FIG. 5 illustrates an example of a design characteristic-aware grid morphing method.

FIG. 5 illustrates an example of a design characteristic-aware grid morphing method. Some embodiments employ a method which first defines sensitivity of a characteristic of the design with respect to the changes in cell shapes at 502. At 504, the method then computes the sensitivity of the design characteristic. The method may proceed to modify the objective functions of grid morphing so as to optimize perturbation to the grid and the design characteristic instead of perturbation alone at 506. The method may also proceed to modify the pressure-based solver to incorporate the design characteristic according to the sensitivity at 508. Some other embodiments may define and incorporate more than one sensitivity in the grid morphing algorithm.

The following illustrates an example of the above grid-morphing method which incorporates the netlength design characteristic. Here, the coordinates of the corner points in both directions are denoted by a single vector p. The above method first computes the sensitivity of the overall netlength of the design with respect to changes in the width and height of the cells. After the sensitivities, $s_{ij}$, are computed, the grid morphing objective function may be modified in order to optimize a weighted sum of the perturbation and the netlength instead of the perturbation alone as shown in Eq. (1). The method may also modify the pressure-based solver to incorporate netlength by, for example, weighting the pressure parameters according to sensitivities. Note that the weights may be changed in each iteration of the grid morphing process so they uniformly tend to one. For example, Eq. (1) may be modified as follows:

$$\text{minimize} \sum_{(i,j) \in E} (|p'_i - p'_j| - |p_i - p_j|)^2 + s_{ij} \cdot |p'_i - p'_j| \quad (7)$$

$$\text{subject to } A^i_c \geq A_c \forall\, c \in C$$

In general, it is relatively computationally expensive to determine the exact sensitivities of the netlengths. Therefore, in some embodiments, it may be desirable to determine the sensitivities using a fast estimation technique such as the one in the implementation of various embodiments of the invention. The sensitivities, $s_{ij}$, may be computed by summing the estimation of sensitivities for each net. For example, for a given local net, the sensitivity with respect to width changes may be defined as:

$$s_{ij} = \frac{w_n}{w_c},$$

where $w_n$ denotes the width of the half perimeter bounding box or the summation of all the horizontal wires in the Steiner estimation, and $w_c$ denotes the width of the cell. Similarly, the sensitivity with respect to height changes may be defined as $$s_{ij} = \frac{h_n}{h_c},$$

where $h_n$ denotes the height of a half perimeter bounding box or the summation of all the vertical wires in the Steiner estimation, and $h_c$ denotes the height of the cell. For a global net, the netlength sensitivity with respect to the width changes of the cell may be distributed between the intersecting cells according to the ratio of the width of the overlap of the bounding box of the net and the actual cell width. Similarly, the netlength sensitivity with respect to the height changes of the cell may be distributed between the intersecting cells according to the ratio of the height of the overlap of the bounding box of the net and the actual cell height.

Figure 6:
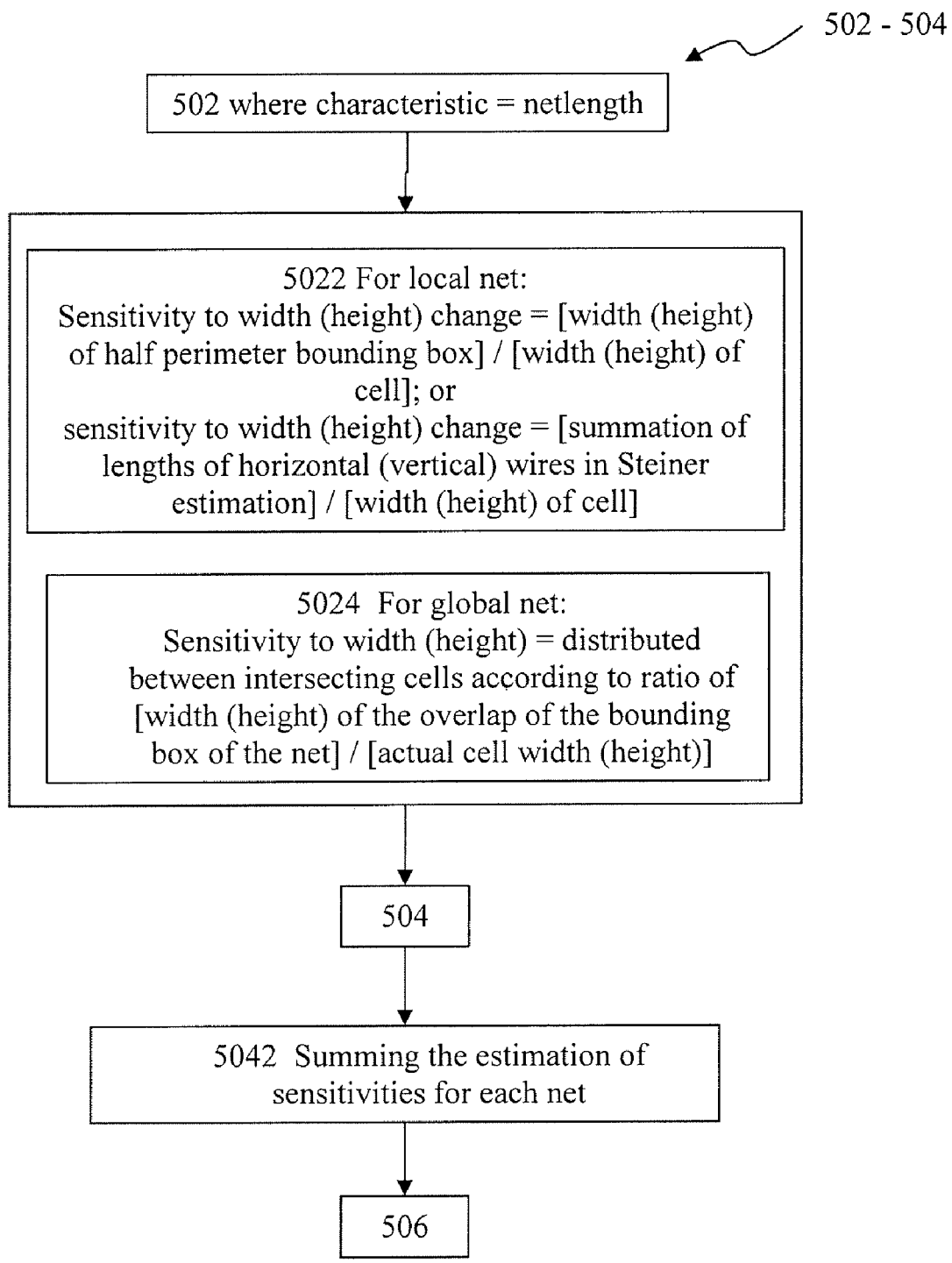
FIG. 6 illustratively depicts the above example of a methodology employing the grid morphing technique while taking the sensitivity of the netlength with respect to the change of grid shapes into account.

FIG. 6 illustratively depicts the above example of a methodology employing the grid morphing technique while taking the sensitivity of the netlength with respect to the change of grid shapes into account. At 502, the method identifies the netlength sensitivity. At 5022, the method defines the sensitivity with respect to width and height changes for a local net. At 5024, the method defines the sensitivity with respect to width and height changes for a global net. The method then proceeds to compute the sensitivities at 504. At 5042, the method sums the estimation of sensitivities for each net and then proceeds to step 506.

Figure 7:
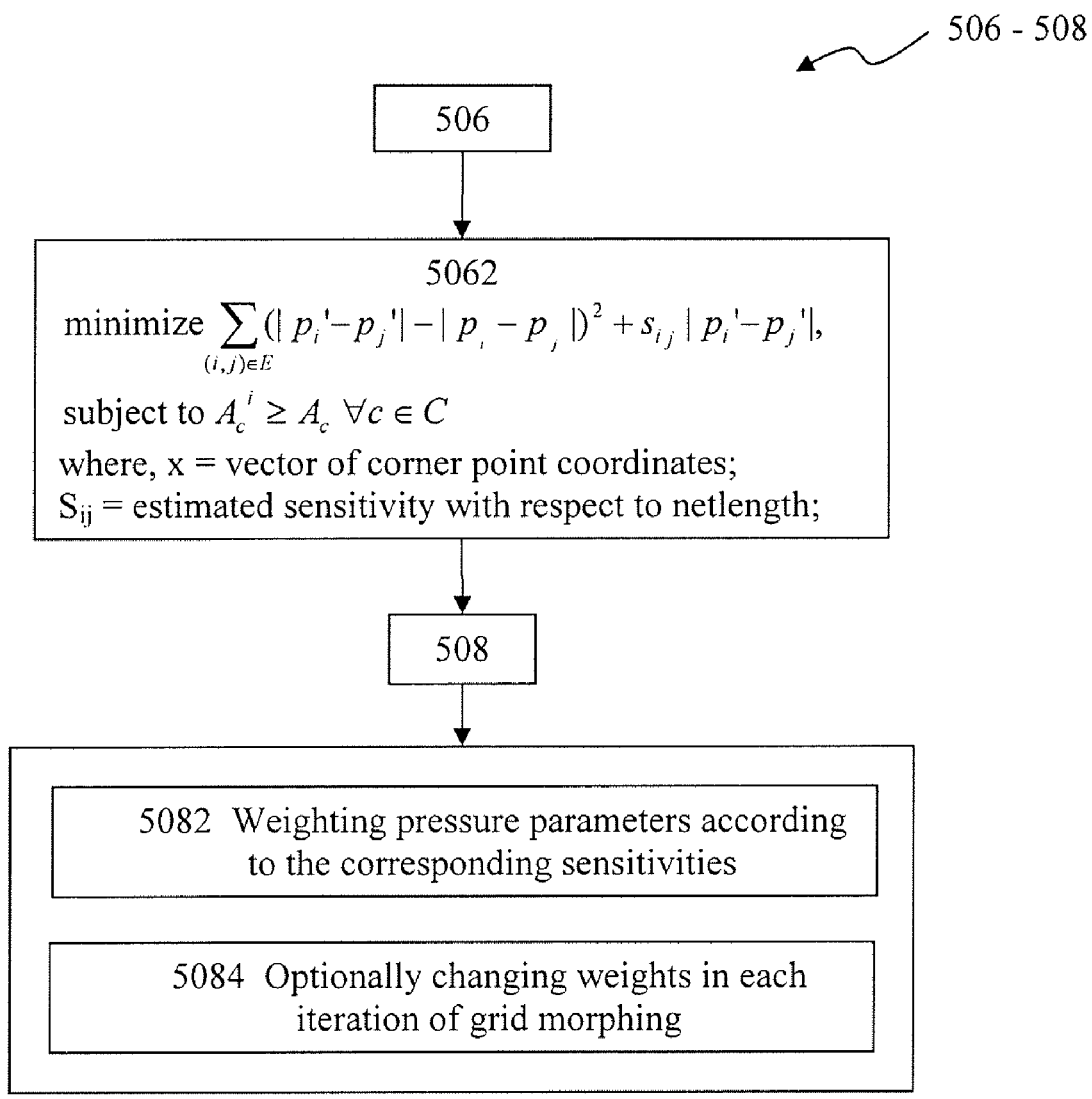
FIG. 7 illustratively depicts the above example of a methodology employing the grid morphing technique while modifying the pressure-based solver to incorporate the sensitivity of a design characteristic with respect to changes in grid shapes.

FIG. 7 illustratively depicts the above example of a methodology employing the grid morphing technique while modifying the pressure-based solver to incorporate the sensitivity of a design characteristic with respect to changes in grid shapes. The method starts at step 506. At 5062, the method then modifies the perturbation function by adding the sensitivity dependent element to it. The method then proceeds to step 508. At 5082, the method assigns weights to pressure parameters according to the corresponding sensitivities. At 5084, the method optionally changes weights in each iteration of grid morphing.

Figure 8:
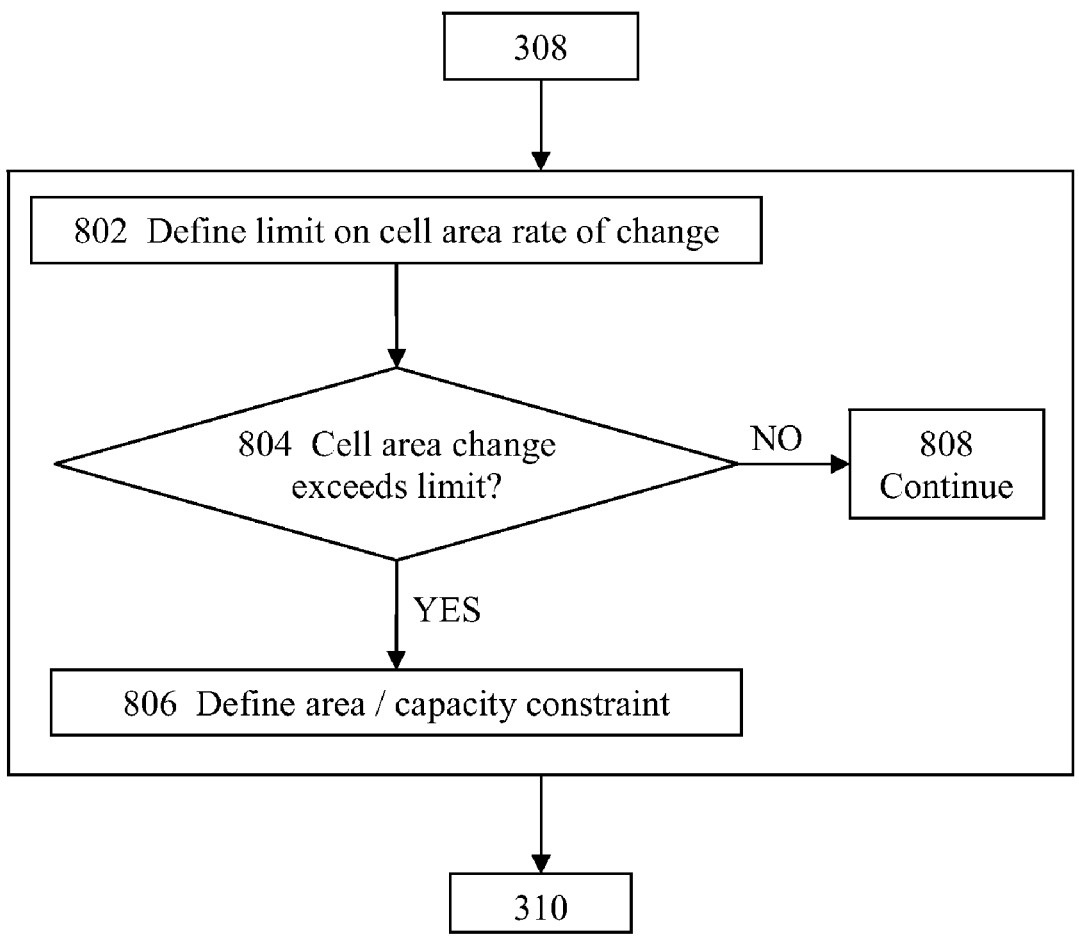
FIG. 8 illustrates an example of a methodology employing the grid morphing technique while taking the placement density control into account.

FIG. 8 illustrates an example of a methodology employing the grid morphing technique while taking the placement density control into account. Several embodiments first continue from step 308. At 802, the method defines a limit on the cell area change. At 804, the method determines whether the cell area change exceeds the predefined limit during each iteration of the grid morphing. If the cell area change during an iteration does not exceed the predefined limit the method proceeds to continue, 808, to step 310. If on the other hand the cell area change exceeds the predefined limit during an iteration of grid morphing the method then defines additional area and/or capacity constraints and proceeds to 310 to solve for the new corner point location with the additional area and/or capacity constraints. These additional constraints may be added for the purpose of preventing disproportional area blow-up when different areas have different overload or different density. As described above, some embodiments employ a method which places bounds on the cell areas so the changes in placement are limited. This controlled limit on the cell area and thus the cell density can make the grid morphing process more stable by prevent large movements in the grid morphing process which may have a negative influence on the stability of the morphing process.

The following example illustrates the method described above. For example, the method may define the limit on the relative cell area change during each iteration of the grid morphing process to be 2. If the change in cell area does not exceed the limit, the grid morphing process continues to solve for the new locations of the corner points after one iteration of grid morphing. If, on the other hand, the change in the cell area exceeds the prescribed limit of 2 in a particular iteration, the method may further impose an additional constraint such as the follows:

$$A_n = a_n \cdot \left[ 1 + c \cdot \frac{\frac{T_n}{a_n} - 1}{\text{Max}_{k \in N} \frac{T_k}{a_k} - 1} \right], \quad (8)$$

where $\text{Max}_{k \in N} T_k / a_k > 1$

In the above formula for the additional area constraint, $A_n$=new target area for cell n, $a_n$=actual area of cell n, $T_n$=total area of the gates contained in cell n, c is the limit of cell area change, and N represents the set of all cells. In one embodiment, c equals 2. The method then proceeds to solve for the new locations of the corner points after one iteration of the grid morphing process with the additional area constraint (8). Note that in the above methods, if the movement and/or morphing of the cells is insufficient to resolve all overlaps, some other embodiments may employ the grid morphing technique repeatedly to iteratively remove all the overlaps.

Figure 9:
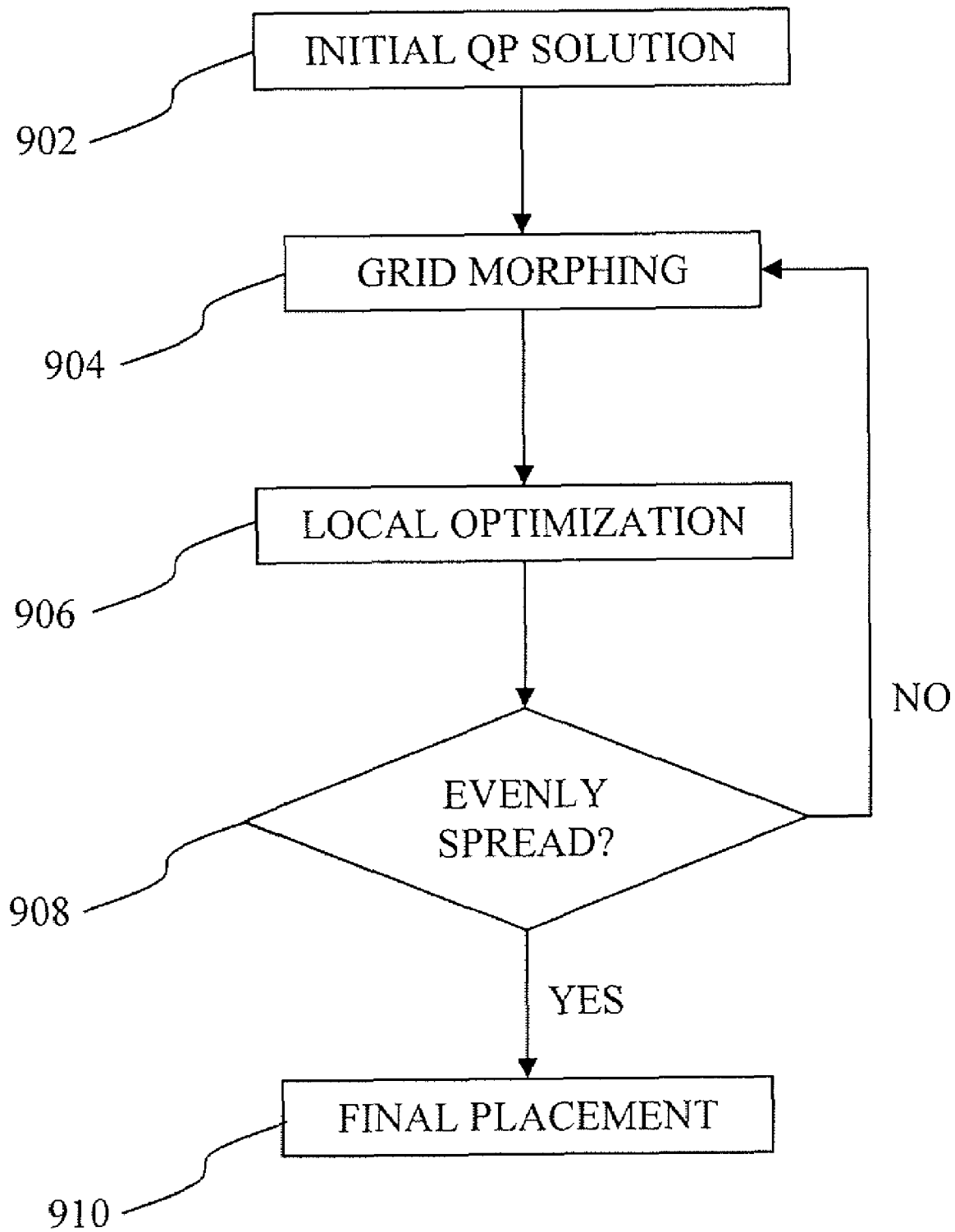
FIG. 9 illustrates an example of a placement method that combines the grid morphing and local optimization algorithms.

FIG. 9 illustrates an example of a placement method that combines the grid morphing and local optimization algorithms. Note that this method may use an iterative approach to alternate between the grid morphing and the local optimization algorithm. The method first determines the initial placement by using methods such as the quadratic placement algorithms at 902. At 904, the method performs the grid morphing techniques as described in the foregoing sections. At 906, the method performs local optimization to, for example, optimize the wirelength or other design objectives. Note that local optimization may be accomplished by any algorithms. An example of the local optimization algorithms is published as "*FastPlace: An Efficient Analytical Placement Technique*" by N. Viswanathan and C. Chu in the International Symposium on Physical Design 2004. By combining the local optimization algorithms with the grid morphing techniques, the placement solution is allowed to better approximate the more desirable linear metric rather than the quadratic metric given by a typical quadratic placement solution.

Then the method determines whether the objects of interest are sufficiently spread or meet certain objectives at 908. Where the method determines that the objects of interest are not sufficiently spread or fail to meet certain objectives, the method then goes back to step 904 to perform grid morphing and repeats the steps until all objectives are met at 908, and then the method proceeds to 910 to finalize the placement.

Figure 10A:
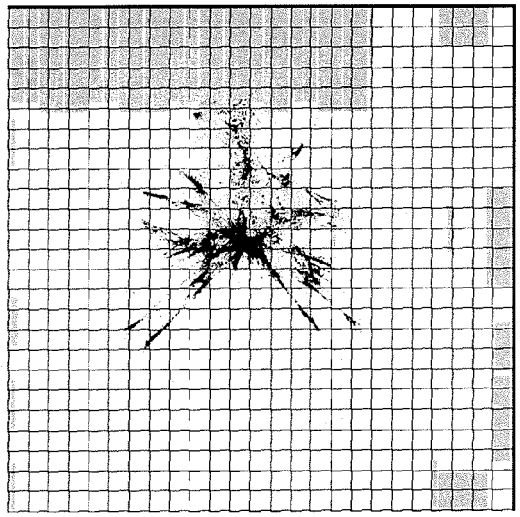
FIGS. 10A-10D illustrate some exemplary stages of the operations of the grid morphing techniques on an example design.
Figure 10B:
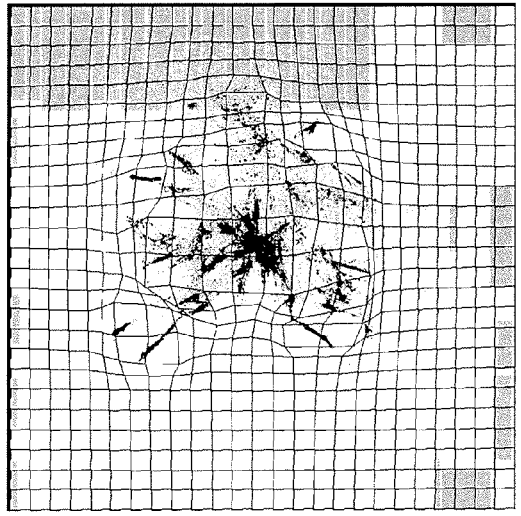
Figure 10C:
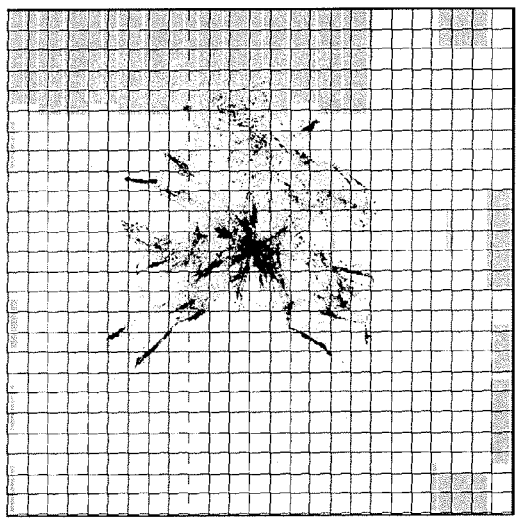
Figure 10D:
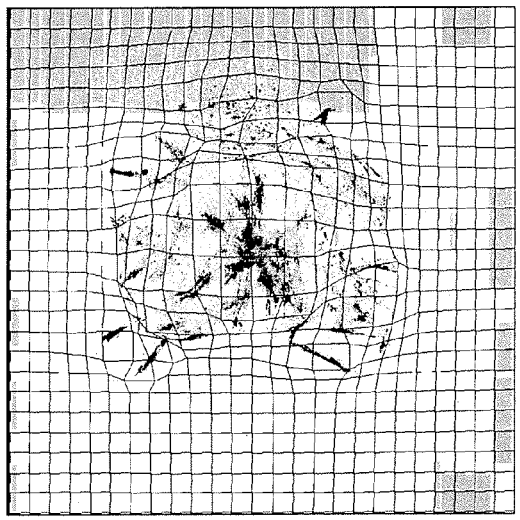

FIGS. 10A-10D illustrate some exemplary stages of the operations of the grid morphing techniques on an example design. In these figures, the shaded areas indicate objects of interest to be placed. The larger shaded rectangular regions represent macroblocks. Also, areas of greater degrees of cell overlap are shaded in darker colors. FIG. 10A illustrates the initial placement and initial uniform grid. FIG. 10B illustrates the result after one grid morphing step with the grid points moved to their new locations. FIGS. 10C and 10D illustrate the successive application of the grid morphing techniques during the next iterations of the overall placement algorithm.

In the foregoing specification, some embodiments of the invention have been described with reference to specific embodiments thereof. It will, however, be evident that various modifications and changes may be made thereto without departing from the broader spirit and scope of various embodiments of the invention. For example, the reader is to understand that the specific ordering and combination of process actions shown in the process flow diagrams described herein is merely illustrative, and some embodiments of the invention can be performed using different or additional process actions, or a different combination or ordering of process actions. The specification and drawings are, accordingly, to be regarded in an illustrative rather than restrictive sense.

System Architecture Overview

Figure 11:
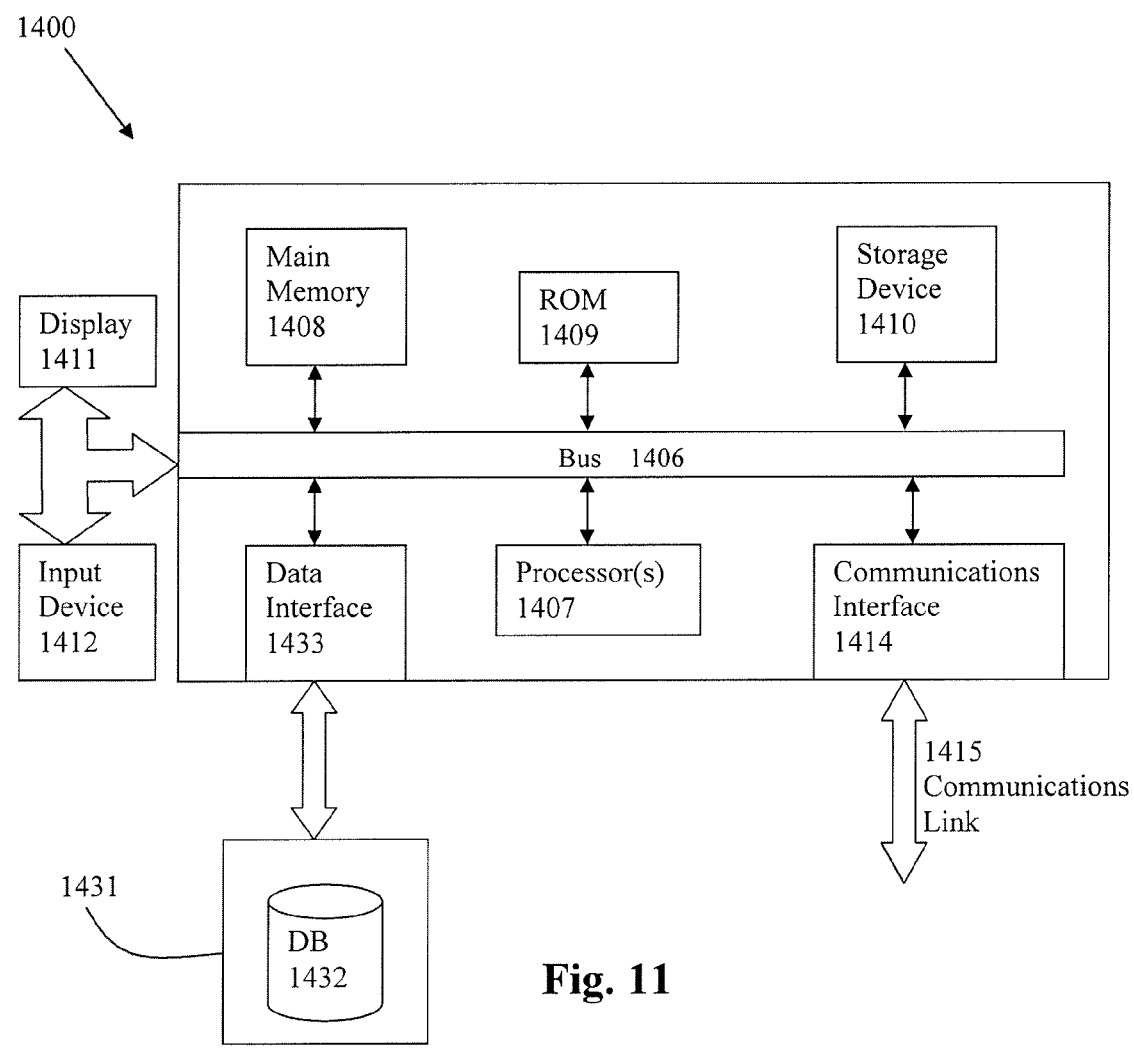
FIG. 11 illustrates an example system with which various embodiments of the invention may be employed.

FIG. 11 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (e.g., mouse or trackball. Not shown). The computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433, which is coupled to the bus 1406, transmits and receives signals, e.g., electrical, electromagnetic or optical signals, that include data streams representing various types of signal information, e.g., instructions, messages and data.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer-implemented method for grid-morphing for placing an object of interest in a design, comprising:
 using at least one processor configured for:
  imposing a first grid over a placement area;
  identifying a first objective function, wherein the first objective function is used to improve stability of placement of a plurality of objects of interest in the design;
  determining a grid morphing process by using at least the first objective function to improve the stability of the placement of the plurality of objects of interest in the design, in which the grid morphing process transforms the first grid into a second grid;

performing the grid morphing process for placing the object of interest in the design; and using a computer readable storage medium or a computer storage device configured for storing a result of the performing the grid morphing process or using a display apparatus configured for displaying the result.

2. The method of claim 1, in which the first grid is a regular grid.

3. The method of claim 1, in which the step of solving for a grid morphing process is further based upon at least one constraint on the first grid.

4. The method of claim 1, further comprising:
determining whether objects of interest to be placed are sufficiently spread.

5. The method of claim 1, further comprising:
mapping the objects of interest in each cell to a new location based upon the grid morphing process.

6. The method of claim 1, in which the step of solving for a grid morphing process comprises:
determining a new location of a corner point.

7. The method of claim 6, in which the step of performing the grid morphing process is based in part upon the new location of the corner point.

8. The method of claim 6, in which the step of determining a new location for a corner point is based upon a new border point location.

9. The method of claim 8, in which the new border point location is determined according to a first pressure for the first cell and a second pressure for a second cell.

10. The method of claim 9, in which the new border point location is determined according to at least one constraint for the new border point location.

11. The method of claim 10, further comprising:
equalizing the first and the second pressure to determine the new border point location, in which the at least one constraint is not completely satisfied.

12. The method of claim 10, further comprising:
optimizing a second objective function to determine the new border point location.

13. The method of claim 1 further comprising:
determining a sensitivity of a design characteristic with respect to a change due to the step of performing the grid morphing process.

14. The method of claim 13 further comprising:
modifying the first objective function to incorporate the sensitivity of a design characteristic.

15. The method of claim 13 further comprising:
modifying a solver for the grid morphing process to incorporate the sensitivity.

16. The method of claim 13, in which the characteristic comprises netlength.

17. The method of claim 16, further comprising:
define a constraint on the change in cell area for the step of solving the first objective function.

18. The method of claim 1, further comprising:
defining a limit on change in cell area due to the grid morphing; and
determining whether the change in cell area due to grid morphing exceeds the limit.

19. The method of claim 1, further comprising:
determining whether an objective is met after employing a local optimization process.

20. The method of claim 19 further comprising:
alternating between the grid morphing process and the local optimization process until the objective is met.

21. The computer-implemented method of claim 1, wherein the first object function is used in the act of determining the grid morphing process for performing a process comprising:
reducing perturbation to a first entity; and
satisfying one or more constraints for at least some of the plurality of objects of interest.

22. The computer-implemented method of claim 21, wherein the first entity comprises the first grid.

23. The computer-implemented method of claim 21, wherein the first entity comprises a plurality of points defining boundaries of at least some of the plurality of objects of interest.

24. The computer-implemented method of claim 21, wherein the one or more constraints comprises a first constraint on areas of the at least some of the plurality of objects of interest.

25. The computer-implemented method of claim 21, wherein the process further comprises:
improving sensitivity of a design characteristic, wherein the sensitivity of the design characteristic measures how the design characteristic responds to one or more changes caused by the grid morphing process.

26. The computer-implemented method of claim 25, wherein the act of improving sensitivity of the design characteristic comprises:
modifying the first objective function to incorporate the sensitivity into the first objective function; and
optimizing the first objective function, which is modified, with respect to the sensitivity in addition to the stability of the placement of the plurality of objects of interest.

27. The computer-implemented method of claim 1, wherein the act of determining the grid morphing process comprises:
using at least a pressure-based process to determine the second grid based at least in part upon a plurality of areas of a plurality of cells in the first grid or the second grid.

28. The computer-implemented method of claim 27, wherein the act of using at least the pressure-based process to determine the second grid comprises:
identifying at least two cells which share an edge in the first grid or the second grid;
determining a first pressure for a first cell of the at least two cells by referencing a first target area of the first cell and a first actual area of the first cell;
determining a second pressure for a second cell of the at least two cells by referencing a second target area of the second cell and a second actual area of the second cell; and
determining the second grid by using at least the first pressure and the second pressure.

29. A computer program product comprising a computer-usable storage medium having executable code which, when executed by a processor, causes the processor to execute a process for grid-morphing for placement of an object of interest, the process comprising:
using at least the processor configured for:
imposing a first grid over a placement area;
identifying a first objective function, wherein the first objective function is used to improve stability of placement of a plurality of objects of interest in the design;
determining a grid morphing process by using at least the first objective function to improve the stability of the placement of the plurality of objects of interest in the design, in which the grid morphing process transforms the first grid into a second grid;

performing the grid morphing process for placing the object of interest in the design;

using a computer readable storage medium or a computer storage device configured for storing a result of the performing the grid morphing process or using a display apparatus configured for displaying the result.

30. A computer system for grid-morphing for placing an object of interest, comprising:

a processor configured for:

imposing a first grid over a placement area;

identifying a first objective function, wherein the first objective function is used to improve stability of placement of a plurality of objects of interest in the design;

determining a grid morphing process by using at least the first objective function to improve the stability of the placement of the plurality of objects of interest in the design, in which the grid morphing process transforms the first grid into a second grid;

performing the grid morphing process for placing the object of interest in the design; and a computer readable storage medium or a computer storage device configured for storing a result of the performing the grid morphing or a display apparatus configured for displaying the result.

* * * * *